(12) United States Patent
Gao et al.

(10) Patent No.: US 9,673,356 B2
(45) Date of Patent: Jun. 6, 2017

(54) PACKAGING DEVICE AND PACKAGING METHOD

(71) Applicant: BOE TECHNOLOGY GROUP CO., LTD., Beijing (CN)

(72) Inventors: Xinwei Gao, Beijing (CN); Dan Wang, Beijing (CN); Rui Hong, Beijing (CN); Chao Kong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/892,414

(22) PCT Filed: Apr. 16, 2015

(86) PCT No.: PCT/CN2015/076708
§ 371 (c)(1),
(2) Date: Nov. 19, 2015

(87) PCT Pub. No.: WO2016/074437
PCT Pub. Date: May 19, 2016

(65) Prior Publication Data
US 2016/0284942 A1 Sep. 29, 2016

(30) Foreign Application Priority Data
Nov. 13, 2014 (CN) .......................... 2014 1 0641094

(51) Int. Cl.
*H01L 33/48* (2010.01)
*H01L 21/67* (2006.01)
*H01L 51/52* (2006.01)

(52) U.S. Cl.
CPC ...... *H01L 33/483* (2013.01); *H01L 21/67126* (2013.01); *H01L 51/5246* (2013.01); *H01L 2933/0033* (2013.01)

(58) Field of Classification Search
None
See application file for complete search history.

(56) References Cited

U.S. PATENT DOCUMENTS

2008/0164593 A1  7/2008 Hess et al.
2008/0231180 A1* 9/2008 Waffenschmidt ... H01L 51/5203
313/506
(Continued)

FOREIGN PATENT DOCUMENTS

CN        2384314      6/2000
CN      101807667     8/2010
(Continued)

OTHER PUBLICATIONS

Yadong et al., CN101807667A, Aug. 18, 2010, Machine Translation.*
(Continued)

*Primary Examiner* — Andres Munoz
(74) *Attorney, Agent, or Firm* — Harness, Dickey & Pierce, P.L.C.

(57) ABSTRACT

The present invention discloses a packaging device and a packaging method and relates to a field of manufacturing technique of a display panel. The packaging device is used to package a display panel, the display panel comprising a first substrate and a second substrate that are arranged opposed to each other and are able to be packaged by a sealing material, the packaging device comprising a first adsorption part and a second adsorption part that are able to attract each other through a magnetic force, one of the first adsorption part and the second adsorption part configured to be detachably arranged on the outside of the first substrate, and the other of the first adsorption part and the second adsorption part configured to be detachably arranged on the outside of the second substrate.

13 Claims, 3 Drawing Sheets

(56) References Cited

U.S. PATENT DOCUMENTS

| | | | | |
|---|---|---|---|---|
| 2009/0203283 A1* | 8/2009 | Gentile | ............... | H01L 51/5246 |
| | | | | 445/25 |
| 2011/0114991 A1 | 5/2011 | Lee | | |
| 2011/0140373 A1 | 6/2011 | Lee et al. | | |
| 2014/0322827 A1 | 10/2014 | Su | | |
| 2016/0284942 A1* | 9/2016 | Gao | ........................ | H01L 21/56 |

FOREIGN PATENT DOCUMENTS

| | | |
|---|---|---|
| CN | 102244020 | 11/2011 |
| CN | 103187541 | 7/2013 |
| CN | 103681763 | 3/2014 |
| CN | 104362103 | 2/2015 |
| CN | 204167262 | 2/2015 |

OTHER PUBLICATIONS

Xinchao et al., CN102244020A, Nov. 16, 2011, Machine Translation.*
Written Opinion of the International Searching Authority from PCT Application No. PCT/CN2015/076708, Aug. 21, 2015, 5 pages.

* cited by examiner

PACKAGING DEVICE AND PACKAGING METHOD

TECHNICAL FIELD

The present invention relates to a field of manufacturing technique of a display panel, and particularly relates to a packaging device and a packaging method.

BACKGROUND

Nowadays light emitting diode (LED) display panels are packaged mainly by using frit. FIG. 1 is a schematic diagram of a packaging scheme in the prior art in which a first substrate 1 and a second substrate 2 with a light emitting unit 4 arranged thereon are packaged together by a sealing material 3 (for example, frit). The sealing material 3 in solid state is melt by the irradiation of a laser 7 during the process of the packaging, and the first substrate 1 and the second substrate 2 are packaged together after the sealing material 3 is cured again.

The laser can only irradiate a part of sealing material 3 at a time, and stress release will occur between the first substrate 1 and the second substrate 2 when a part of the sealing material 3 is melted. The released stress may separate the first substrate 1 and the second substrate 2, and thus the first substrate 1 and the second substrate 2 cannot be effectively packaged by the sealing material 3, resulting in a problem of poor packaging.

Aiming at the above problem, a solution in the prior art comprises providing a thermal expansion layer and other interposed layer(s) on the outside (the side facing away from the second substrate 2) of the first substrate 1. When the sealing material 3 is irradiated by the laser and melted, the generated heat is also transferred to the thermal expansion layer and the thermal expansion layer is thus expanded, thereby pressing the first substrate 1 against the second substrate 2, which prevents the separation between the first substrate 1 and the second substrate 2 due to stress release. However, this solution needs to keep the laser irradiating from bottom to top (i.e., irradiating in a direction from the second substrate 2 to the first substrate 1), which makes the operation inconvenient. Furthermore, the thermal expansion layer is usually made of organic polymer material or elastic rubber and is apt to cause environmental pollution.

Another solution in the prior art comprises adding a clamping plate component on the outsides of both the first substrate 1 and the second substrate 2 so as to apply a clamping force to the first substrate 1 and the second substrate 2, and meanwhile providing a sensor to sense the pressure between the first substrate 1 and the second substrate 2 so as to avoid poor sealing effect due to weak clamping or device damage due to overclamping, thereby improving packaging quality. However, it is very difficult for the sensor to effectively sense the pressure between the first substrate 1 and the second substrate 2 during packaging in this solution because the distance between the first substrate 1 and the second substrate 2 is very small (generally, below 20 μm). Moreover, the effective integration of the sensor and the two substrates is also a difficult problem.

SUMMARY OF THE INVENTION

The embodiments of the present invention provide a packaging device and a packaging method to prevent poor packaging due to stress release between two substrates of a light emitting diode display panel when a sealing material is melt.

As a first aspect of the embodiments of the present invention, there is provided a packaging device for packaging a display panel, the display panel comprising a first substrate and a second substrate that are arranged opposed to each other and are able to be packaged by a sealing material, the packaging device comprising a first adsorption part and a second adsorption part that are able to attract each other through magnetic force, one of the first adsorption part and the second adsorption part configured to be detachably arranged on the outside of the first substrate, and the other of the first adsorption part and the second adsorption part configured to be detachably arranged on the outside of the second substrate.

Preferably, the first adsorption part is made of a ferromagnetic material and the second adsorption part comprises an electromagnet.

Preferably, the packaging device further comprises a first adsorption part carrier on which the first adsorption part is arranged.

Preferably, the first adsorption part comprises a plurality of sub-adsorption parts with intervals formed therebetween, and the first adsorption part carrier is transparent at least in the portions corresponding to the intervals.

Preferably, the packaging device further comprises an isolation part arranged between the electromagnet and one of the first substrate and the second substrate on the outside of which the electromagnet is arranged, and the isolation part is made of a non-ferromagnetic material.

Preferably, the electromagnet comprises a plurality of sub-electromagnets that are controlled individually.

Preferably, the display panel is a light emitting diode display panel.

As a second aspect of the embodiments of the present invention, there is provided a packaging method for packaging a display panel, the display panel comprising a first substrate and a second substrate that are arranged opposed to each other, the packaging method comprising the steps of:

providing a solid-state sealing material on at least one of the first substrate and the second substrate;

aligning the first substrate and the second substrate;

arranging one of a first adsorption part and a second adsorption part on the outside of the first substrate;

arranging the other of the first adsorption part and the second adsorption part on the outside of the second substrate;

melting the sealing material so as to connect the first substrate and the second substrate, wherein the first adsorption part and the second adsorption part attract each other through a magnetic force at least when the sealing material is melted; and curing the melted sealing material.

Preferably, the orthographic projections of the first adsorption part and the second adsorption part on the first substrate and/or the second substrate at least partly overlap.

Preferably, the positions of the first adsorption part and the second adsorption part correspond to the positions of the sealing material.

Preferably, the first adsorption part is made of a ferromagnetic material and the second adsorption part comprises an electromagnet, wherein in the step of melting the sealing material, the electromagnet is energized such that the second adsorption part generates a magnetic force, and in the step of curing the melted sealing material, the second adsorption part is deenergized.

Preferably, laser light is used to melt the sealing material, and the electromagnet comprises a plurality of sub-electromagnets that are controlled individually and arranged around display area of the display panel, wherein in the step of melting the sealing material, the sub-electromagnet corresponding to an area irradiated by the laser light is energized.

Preferably, a strength of an electric signal applied on the sub-electromagnet increases with the increase of an intensity of the laser light irradiated on the area to which the sub-electromagnet corresponds;

the strength of the electric signal applied on the sub-electromagnet decreases with the decrease of the intensity of the laser light irradiated on the area to which the sub-electromagnet corresponds.

The present invention can effectively avoid the separation between the first substrate and the second substrate due to stress release during the process of melting the sealing material, and thus suppresses poor packaging caused by the separation. Meanwhile, the first adsorption part and the second adsorption part in the present invention are both parts additionally mounted on the display panel and can be recycled, therefore cost can be saved.

BRIEF DESCRIPTION OF THE DRAWINGS

The accompany drawings are provided as a part of the specification only for further understanding of the present invention and explaining the present invention together with the following embodiments, and should not be interpreted as a restriction to the present invention.

DETAILED DESCRIPTION OF THE INVENTION

Embodiments of the present invention will be described in detail by reference to the accompany drawings. However, it is appreciated that the embodiments described herein are only for illustrating and explaining the present invention rather than restricting the present invention.

Figure 1:
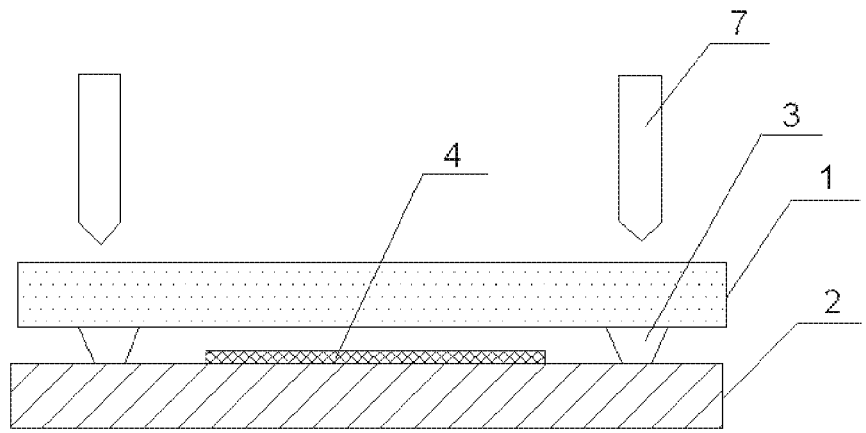
FIG. 1 is a schematic diagram of a packaging scheme in the prior art.
Figure 2:
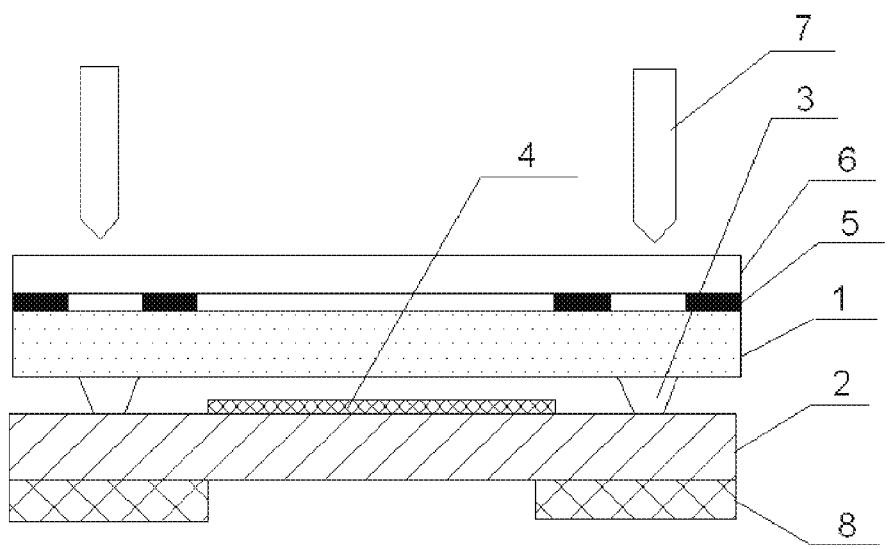
FIG. 2 is a schematic diagram illustrating a packaging device according to an embodiment of the present invention.

The present invention provides a packaging device for packaging a display panel such as a light emitting diode display panel. In the following embodiments, detailed description of the packaging device will be given by taking a light emitting diode display panel as an example of the display panel. FIG. 2 illustrates a light emitting diode display panel comprising a first substrate 1 and a second substrate 2 which are arranged opposed to each other and can be packaged by a sealing material 3. The packaging device comprises a first adsorption part 5 and a second adsorption part 8 that can attract each other through a magnetic force. One of the first adsorption part 5 and the second adsorption part 8 is configured to be detachably arranged on the outside of the first substrate 1, i.e., the side of the first substrate 1 that faces away from the second substrate 2, and the other of the first adsorption part 5 and the second adsorption part 8 is configured to be detachably arranged on the outside of the second substrate 2, i.e., the side of the second substrate 2 that faces away from the first substrate 1.

Herein the light emitting diode display panel may be an Organic Light Emitting Diode (OLED) display panel or an Active Matrix Organic Light Emitting Diode (AMOLED) display panel. The first substrate 1 herein may be a covering plate and the second substrate 2 may be a display substrate comprising a light emitting unit 4, or vice versa. If the second substrate 2 is the display panel, the light emitting unit 4 may be formed on the second substrate 2 by vacuum evaporation, ink-jet printing, spin coating or the like. Furthermore, the substrate 2 may comprise structures such as thin film transistor device(s), cathode electrode(s), anode electrode(s) and the like.

In fabricating a light emitting diode display panel, it is necessary to form solid state sealing material 3 on at least one of the first substrate 1 and the second substrate 2 by screen printing or the like, and to melt the sealing material 3 after aligning the first substrate 1 and the second substrate 2 so as to connect the first substrate 1 and the second substrate 2. After the first substrate 1 and the second substrate 2 are connected, the sealing material 3 in melted state is cured so as to package the first substrate 1 and the second substrate 2.

In the present invention, during the process of melting the sealing material 3, the first adsorption part 5 and the second adsorption part 8 attract each other through a magnetic force such that the first substrate 1 and the second substrate 2 are properly pressed against each other, which avoids the separation between the first substrate 1 and the second substrate 2 due to the stress release during the melting of the sealing material and thus prevents the problem of poor packaging caused by such separation. Comparing with the prior art, pressing the first substrate 1 and the second substrate 2 against each other through a magnetic force has the advantages of low costs and easy operation, and is less likely to damage the display panel.

In the present invention, there is no particular restriction to the detailed structures of the first adsorption part 5 and the second adsorption part 8. For example, both the first adsorption part 5 and the second adsorption part 8 are magnets that can generate a magnetic force and attract each other. Alternatively, one of the first adsorption part 5 and the second adsorption part 8 is a magnet that can generate a magnetic force, and the other is made of a ferromagnetic material that can be attracted by a magnetic force. The magnet may be a permanent magnet or an electromagnet. For the convenience of controlling and good display effect, preferably the magnet is an electromagnet which is energized only when the sealing material 3 is melted and is not energized at any other stage.

In an example, the first adsorption part 5 is made of a ferromagnetic material and the second adsorption part 8 comprises an electromagnet. The electromagnet can generate an attraction force for the first adsorption part 5 made of a ferromagnetic material so as to make both the first substrate 1 and the second substrate 2 totally attached to the sealing material 3 during the process of melting the sealing material 3, that is, to keep the first substrate 1 and the second substrate 2 being connected all the time.

Furthermore, the ferromagnetic material has good thermal conductivity, and can also act as a thermal conductive layer if it is in direct contact with the display panel so as to decrease the adverse influence of the heat released during the melting of the sealing material 3 on the light emitting unit 4. This effect is more significant especially when the light emitting unit 4 is an organic light emitting unit.

It is appreciated by those skilled in the art that the ferromagnetic material in the present invention refers to a material that can be easily magnetized, for example, iron, cobalt, nickel or the like.

Furthermore, the packaging device may further comprise a first adsorption part carrier 6 on which the first adsorption part 5 is arranged. In the present invention, the first adsorption part 5 may be formed of a ferromagnetic material such as iron, cobalt, nickel, alloy thereof or the like on the first adsorption part carrier 6 by sputtering, vacuum evaporation or the like. The usage of the first adsorption part carrier 6 facilitates the operations such as the mounting, aligning or the like on the first adsorption part 5.

In FIG. 2, the first adsorption part 5 comprises a plurality of sub-adsorption parts with intervals formed therebetween. The first adsorption part carrier 6 is transparent at least in the portions corresponding to the intervals. When packaging the light emitting diode display panel, the positions of the intervals should correspond to the positions where the sealing material 3 is located such that the laser light emitted by the laser 7 can irradiate the sealing material 3 so as to melt it.

Obviously, the first adsorption part carrier 6 may be transparent as a whole so that the laser 7 can irradiate at an angle with more freedom, which facilitates the operation. Since the wavelength of the laser light that can melt the sealing material 3 is generally in the range of 600-1000 nm, the first adsorption part carrier 6 may be formed of a material with good flatness such as glass, quartz or the like that is well transparent to infra-red light (600-1000 nm).

Figure 3:
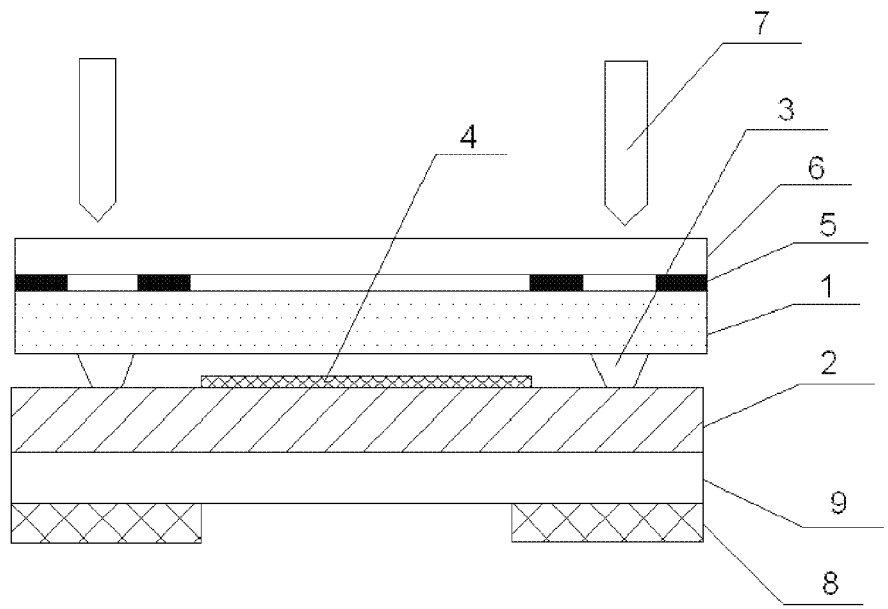
FIG. 3 is another schematic diagram illustrating a packaging device according to an embodiment of the present invention.

In order to prevent contamination when the electromagnet in the second adsorption part 8 is directly attached to the first substrate 1 or the second substrate 2, the packaging device provided in the present invention may further comprise an isolation part 9. The isolation part 9 is arranged between the electromagnet and one of the first substrate 1 and the second substrate 2 on the outside of which the electromagnet is arranged. For example, as shown in FIG. 3, the electromagnet is arranged on the outside of the second substrate 2, i.e., the side of the second substrate 2 that faces away from the first substrate 1, and the isolation part 9 is arranged between the electromagnet and the second substrate 2.

The isolation part 9 is made of a non-ferromagnetic material which refers to a material that would not have magnetism under the action of a magnetic field. Therefore the isolation part 9 would not affect the magnetic field generated by the electromagnet.

Preferably, after the arrangement of the packaging device is finished, i.e., after the first adsorption part 5 and the second adsorption part 8 are arranged on the first substrate 1 and the second substrate 2, the orthographic projections of the first adsorption part 5 and the second adsorption part 8 on the first substrate 1 or the second substrate 2 at least partly overlap, i.e., the positions of the first adsorption part 5 and the second adsorption part 8 correspond to each other such that the attraction force generated between the first adsorption part 5 and the second adsorption part 8 can better act on the first substrate 1 and the second substrate 2 and press them tightly, which facilitates the enhancement of the packaging effect.

As described above, the first adsorption part 5 comprises a plurality of sub-adsorption parts, and the sub-adsorption parts may respectively correspond to the outer periphery and/or inner periphery of the positions of the sealing material 3.

Figure 4:
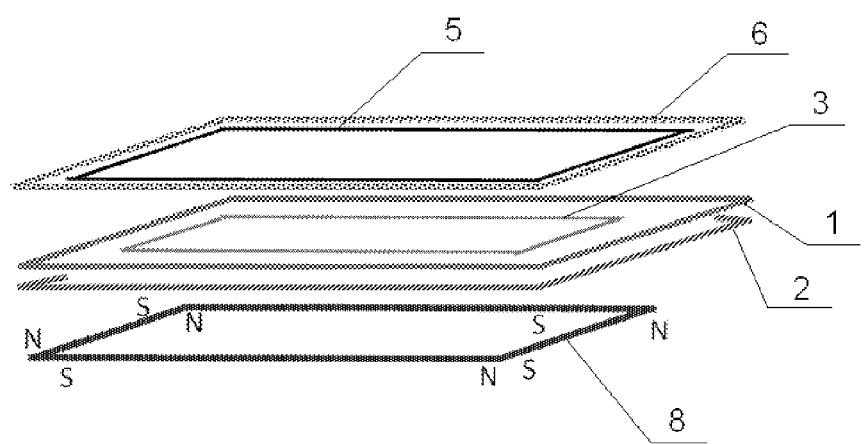
FIG. 4 is a schematic stereogram illustrating a packaging device according to an embodiment of the present invention.

FIG. 4 is the schematic stereogram illustrating the packaging device according to the embodiment of the present invention. The second adsorption part 8 in FIG. 4 comprises a plurality of sub-electromagnet that are controlled individually and are arranged around display area of the light emitting diode display panel. For example, in FIG. 4, the magnetic poles of the plurality of sub-electromagnet are connected to each other in sequence, that is, the N pole of each sub-electromagnet is connected to the S pole of its adjacent sub-electromagnet and the S pole of each sub-electromagnet is connected to the N pole of its adjacent sub-electromagnet.

Preferably, the pattern formed by the plurality of the sub-electromagnets with their poles connected in sequence is in a plane parallel to the plane in which the first adsorption part 5 is located so as to facilitate the fabrication and to make the pressure between the first substrate 1 and the second substrate 2 more uniform.

In the present invention, the electric signal applied to the electromagnet may synchronize with the laser light signal emitted by the laser 7. In other words, as the scanning area of the laser light on the sealing material 3 and the intensity of the laser light change, the range and strength of the magnetic field generated by the electromagnet may be adjusted. In this way, the pressure applied on the melted area of the sealing material 3 as well as the first substrate 1 and the second substrate 2 nearby can be adjusted in time, thereby reducing the poor packaging due to the stress release between the first substrate 1 and the second substrate 2.

As compared with the case in the prior art that the laser light can only be irradiated from bottom to top, a multi-direction and multi-angle irradiation of the laser light can be achieved in the present invention, which facilitates the operation.

Meanwhile, the area of the applied magnetic field and the magnitude of the magnetic force can be controlled precisely in the present invention. For example, in FIG. 4, the electromagnet comprises four sub-electromagnets with the N-pole of one sub-electromagnet connected to the S-pole of another sub-electromagnet in sequence. When the laser light irradiates the sealing material 3 while moving along the sealing material 3, it may be a choice that only the sub-electromagnet corresponding to the area being irradiated by the laser light is energized and the strength of the electric signal is adjusted according to the intensity of current laser light. In this way, the light emitting diode display panel is packaged uniformly in all areas.

The present invention also provides a packaging method for packaging a display panel such as a light emitting diode display panel. The packaging method will be described in detail in the following embodiment by taking the light emitting diode display panel as an example of the display panel. The light emitting diode display panel comprises a first substrate and a second substrate that are arranged opposed to each other.

The packaging method comprises the steps of:

providing a solid-state sealing material on at least one of the first substrate and the second substrate;

aligning the first substrate and the second substrate;

arranging one of a first adsorption part and a second adsorption part on the outside of the first substrate, i.e., the side of the first substrate facing away from the second substrate;

arranging the other of the first adsorption part and the second adsorption part on the outside of the second substrate, i.e., the side of the second substrate facing away from the first substrate;

melting the sealing material so as to connect the first substrate and the second substrate, wherein the first adsorption part and the second adsorption part attract each other through a magnetic force when the sealing material is melted;

curing the melted sealing material.

Preferably, the orthographic projections of the first adsorption part and the second adsorption part on the first substrate and/or the second substrate at least partly overlap, i.e., the position of the first adsorption part corresponds to the position of the second adsorption part, and the positions of both the first adsorption part and the second adsorption part correspond to the positions of the sealing material.

Furthermore, the first adsorption part is made of a ferromagnetic material and the second adsorption part comprises an electromagnet. In the step of melting the sealing material, the electromagnet is energized such that the second adsorption can generate a magnetic force so as to generate an attraction force for the first adsorption part made of a ferromagnetic material and thus make both the first substrate and the second substrate totally attached to the sealing material in melted state. In the step of curing the melted sealing material, the electromagnet is deenergized.

Furthermore, laser light is used to melt the sealing material, and the electromagnet comprises a plurality of sub-electromagnets that are controlled individually and arranged around display area of the light emitting diode display panel, wherein in the step of melting the sealing material, the sub-electromagnet corresponding to the area irradiated by the laser light is energized.

Furthermore, a strength of an electric signal applied on the sub-electromagnet increases with the increase of an intensity of the laser light irradiated on the area to which the sub-electromagnet corresponds;

the strength of the electric signal applied on the sub-electromagnet decreases with the decrease of the intensity of the laser light irradiated on the area to which the sub-electromagnet corresponds.

Hereinafter, the packaging method provided by the present invention will be described in detail according to the structure illustrated in FIG. 2.

Figure 5:
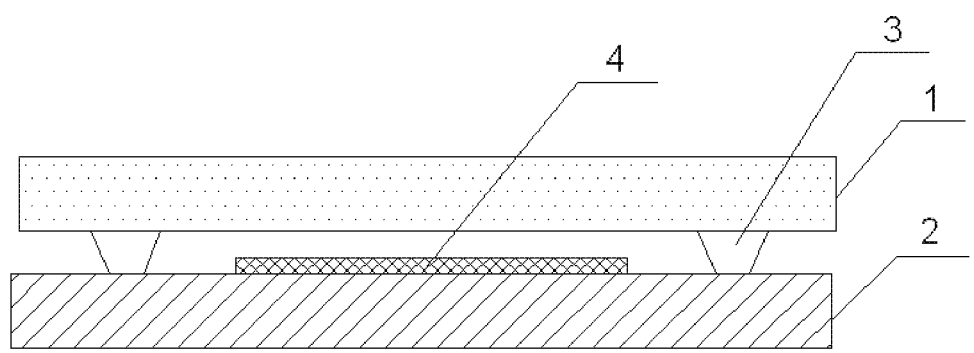
FIG. 5 is a schematic diagram illustrating a packaged light emitting diode display panel.

As for the structure illustrated in FIG. 2, the packaging method comprises:

preparing the second substrate 2 and the light emitting unit 4 through conventional fabricating process of a thin film transistor and evaporating process of a light emitting unit;

forming the sealing material 3 on one side of the first substrate 1 by screen printing, spray coating or the like and molding the sealing material 3 through a baking process;

preparing the first adsorption part 5 made of a ferromagnetic material on the first adsorption part carrier 6 through processes such as vacuum film formation and photolithography, wherein the first adsorption part 5 preferably has a thickness of more than 5 nm, and the first adsorption part 5 may comprise a plurality of sub-adsorption parts each of which preferably has a side width of less than 50 mm;

arranging the first adsorption part 5 on the side of the first substrate 1 with no sealing material 3 provided (i.e., the outside of the first substrate 1);

arranging the second adsorption part 8 on the side of the second substrate 2 with no light emitting unit 4 provided (i.e., the outside of the second substrate 2), herein the second adsorption part 8 refers to an electromagnet;

aligning the first substrate 1 and the second substrate 2, then irradiating and melting the sealing material 3 by the laser light emitted by the laser 7 so as to connect the first substrate 1 and the second substrate 2 together, and meanwhile a voltage is applied to the electromagnet to make it have magnetism and adsorb the first adsorption part 5 made of a ferromagnetic material, thereby pressing the first substrate 1 and the second substrate 2 against each other well;

furthermore, optionally synchronizing the voltage signal applied to the electromagnet with the laser light signal emitted by the laser 7, and according to the change of the stress between the first and second substrate, timely adjusting the adsorption range and the strength of the magnetic field of the electromagnet so as to timely adjust the pressure applied on the melting area of the sealing material 3 as well as the first substrate 1 and the second substrate 2 nearby;

turning off the voltage signal applied on the electromagnet after the sealing material 3 is melted and the packaging of the first substrate 1 and the second substrate 2 is finished;

demounting the first adsorption part carrier 6 (and the first adsorption part 5 arranged thereon) and the second adsorption part 8 and obtaining a packaged light emitting diode display panel as illustrated in FIG. 5.

The sealing material mentioned in the present invention may adopt the existing frit.

The present invention can effectively avoid the separation between the first substrate 1 and the second substrate 2 due to stress release during the process of melting the sealing material 3, and thus solve the problem of poor packaging caused by such separation. Meanwhile, the first adsorption part 5 and the second adsorption part 8 in the present invention are both parts additionally mounted on the display panel, i.e., are arranged on the first substrate 1 and the second substrate 2 detachably and can be recycled, therefore cost can be saved.

It is appreciated that the above embodiments are merely illustrative embodiments employed for illustrating principle of the present invention, and the present invention is not limited thereto. Various variations and improvements may be made by those skilled in the art without departing from the spirit and essence of the invention, and such variations and improvements are also considered as within the protection scope of the present invention.

The invention claimed is:

1. A packaging device for packaging a display panel, the display panel comprising a first substrate and a second substrate that are arranged opposed to each other to be packaged by a sealing material, the packaging device comprising a ferromagnetic material and an electromagnet that attract each other through a magnetic force, the first substrate and the second substrate interposed between the ferromagnetic material and the electromagnet, one of the ferromagnetic material and the electromagnet detachably arranged on a side of the first substrate facing away from the second substrate, and the other of the ferromagnetic material and the electromagnet detachably arranged on a side of the second substrate facing away from the first substrate, the electromagnet comprising a plurality of individually controlled sub-electromagnets, magnetic poles of the plurality of sub-electromagnets connected to each other in sequence with each magnetic pole connected to an opposite polarity magnetic pole of an adjacent one of the plurality of sub-electromagnets.

2. The packaging device according to claim 1, wherein the packaging device further comprises a ferromagnetic material carrier on which the ferromagnetic material is arranged.

3. The packaging device according to claim 2, wherein the ferromagnetic material comprises a plurality of sub-material parts with intervals formed therebetween, and the ferromagnetic material carrier is transparent at least in portions corresponding to the intervals.

4. The packaging device according to claim 3, wherein the display panel is a light emitting diode display panel.

5. The packaging device according to claim 2, wherein the display panel is a light emitting diode display panel.

6. The packaging device according to claim 1, wherein the packaging device further comprises an isolation part arranged between the electromagnet and the side of the one of the first substrate and the second substrate on which the electromagnet is arranged, and the isolation part is made of a non-ferromagnetic material.

7. The packaging device according to claim 6, wherein the display panel is a light emitting diode display panel.

8. The packaging device according to claim 1, wherein the display panel is a light emitting diode display panel.

9. A packaging method for packaging a display panel, the display panel comprising a first substrate and a second substrate that are arranged opposed to each other, the packaging method comprising:

providing a sealing material on at least one of the first substrate and the second substrate;

aligning the first substrate and the second substrate;

arranging one of a ferromagnetic material and an electromagnet on a side of the first substrate facing away from the second substrate, the electromagnet comprising a plurality of individually controlled sub-electromagnets arranged around a display area of the display panel, magnetic poles of the plurality of sub-electromagnets connected to each other in sequence with each magnetic pole connected to an opposite polarity magnetic pole of an adjacent one of the plurality of sub-electromagnets;

arranging the other of the ferromagnetic material and the electromagnet on a side of the second substrate facing away from the first substrate;

melting the sealing material using a laser light so as to connect the first substrate and the second substrate, the ferromagnetic material and the electromagnet attracting each other through a magnetic force at least when the sealing material is melted, at least one of the plurality of sub-electromagnets energized while melting the sealing material, at least one the energized sub-electromagnet corresponding to an area irradiated by the laser light; and curing the melted sealing material, the electromagnet de-energized during curing.

10. The packaging method according to claim 9, wherein orthographic projections of the ferromagnetic material and the electromagnet on the first substrate or the second substrate at least partly overlap.

11. The packaging method according to claim 9, wherein positions of the ferromagnetic material and the electromagnet correspond to positions of the sealing material.

12. The packaging method according to claim 9, wherein a strength of an electric signal applied on the at least one energized sub-electromagnet increases with an increase of an intensity of the laser light irradiated on the area to which the at least one energized sub-electromagnet corresponds; and the strength of the electric signal applied on the at least one energized sub-electromagnet decreases with a decrease of the intensity of the laser light irradiated on the area to which the at least one energized sub-electromagnet corresponds.

13. The packaging method according to claim 9, wherein the display panel is a light emitting diode display panel.

* * * * *